United States Patent [19]

Suzuki et al.

[11] 4,445,274

[45] May 1, 1984

[54] METHOD OF MANUFACTURING A CERAMIC STRUCTURAL BODY

[75] Inventors: Go Suzuki, Nagoya; Kazuo Michishita, Fujiyoshida, both of Japan

[73] Assignee: NGK Insulators, Ltd., Japan

[21] Appl. No.: 265,848

[22] Filed: May 21, 1981

Related U.S. Application Data

[62] Division of Ser. No. 970,444, Dec. 18, 1978, abandoned.

[30] Foreign Application Priority Data

Dec. 23, 1977 [JP] Japan .................. 52-174414

[51] Int. Cl.³ .............................................. H05K 3/30
[52] U.S. Cl. ........................................ 29/832; 29/830; 264/61; 357/80
[58] Field of Search .......... 357/80; 29/832, 831, 29/830; 264/60, 61

[56] References Cited

U.S. PATENT DOCUMENTS

| | | |
|---|---|---|
| 1,522,734 | 1/1925 | McLin . |
| 2,474,988 | 7/1949 | Sargrove . |
| 2,786,969 | 3/1957 | Blitz . |
| 3,189,978 | 6/1965 | Stetson .................. 264/61 |
| 3,323,022 | 5/1967 | DaCosta . |
| 3,346,775 | 10/1967 | Christiansen . |
| 3,397,447 | 8/1968 | Currin et al. .......... 361/402 X |
| 3,458,930 | 8/1969 | Melkeraaen et al. ........ 357/80 X |
| 3,483,308 | 12/1969 | Wakely . |
| 3,489,845 | 1/1970 | Landron . |
| 3,520,054 | 7/1970 | Pensack et al. ............ 29/830 |
| 3,706,840 | 12/1972 | Moyle . |
| 3,735,211 | 5/1973 | Kapnias . |
| 3,798,762 | 3/1974 | Harris et al. ............ 264/61 X |
| 3,846,823 | 11/1974 | Mathews . |
| 3,949,275 | 4/1976 | Müenz .................... 361/402 |

FOREIGN PATENT DOCUMENTS

| | | | |
|---|---|---|---|
| 2424747 | 12/1974 | Fed. Rep. of Germany ..... | 174/68.5 |
| 1254101 | 11/1971 | United Kingdom ............. | 264/61 |
| 1276095 | 6/1972 | United Kingdom ............. | 29/825 |

Primary Examiner—Howard N. Goldberg
Assistant Examiner—Carl J. Arbes
Attorney, Agent, or Firm—Parkhurst & Oliff

[57] ABSTRACT

A ceramic structural body having electronic components thereon comprises a ceramic package of a ceramic layer having substantially uniform thickness. The package comprises a ceramic element of dish-shaped or box-shaped configuration including a base portion, a sidewall portion extending from the base portion substantially at right angles thereto and a flange portion extending from the free end of the sidewall portion substantially at right angles thereto. The ceramic package is formed by press-forming a ceramic green sheet having substantially uniform thickness. A plurality of metal layers are provided on the surface of desired portions of the ceramic element.

8 Claims, 22 Drawing Figures

FIG_6

FIG_7

FIG. 22 member; a plurality of metal layers formed on the surface of desired portions of the ceramic element and the plate member; and at least one electronic component mounted on any one of the metal layers and having electrodes connected to other metal layers through fine lead wires.

DESCRIPTION OF THE PREFERRED EMBODIMENTS

Figure 1:
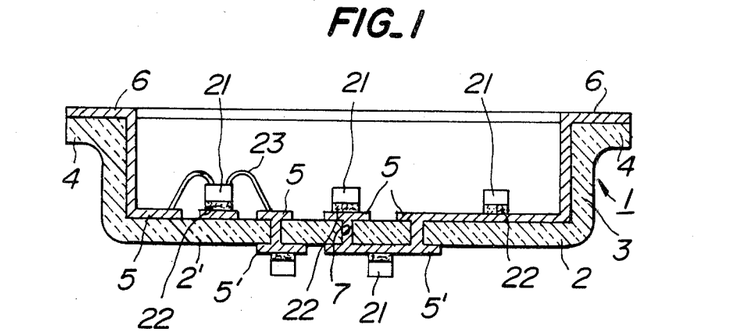
FIG. 1 is a cross-sectional view showing one embodiment of a ceramic structural body according to the present invention.

Referring now to FIG. 1, one embodiment of a ceramic structural body according to the present invention will be described. The ceramic structural body 1 comprises a ceramic element 2 having substantially uniform thickness and at least one electronic component 21. The element 2 comprises a base portion 2', a sidewall portion 3 extending from the edge of the base portion 2' substantially at right angles thereto, and a flange portion 4 extending from the free end of the side wall portion substantially at right angles thereto. The ceramic element 2 is formed by press-forming a ceramic green sheet. Metal layers 5 and 6 consist of a metallized layer formed by plating a conductive metal such as Au or Cu. The metal layer 5 is provided on the sidewall portion 3 or the base portion 2' and the metal layer 6 is provided on the flange portion 4. The ceramic element 2 is provided on its inner and outer major surfaces with electronic components 21, including active and passive elements such as a semiconductor element, capacitor element or resistance element which are mounted by a conventional fitting means such as conductive adhesive 22. The electronic components 21 are electrically connected to the metal layers 5 and 6 through fine lead wires 23, respectively. Reference numeral 7 is a through-hole extended through a base portion of the ceramic element 2 in order to electrically connect the metal layer 5' provided on the outer surface of the ceramic element 2 to the metal layer 5 provided on the inner surface of the ceramic element 2 when the electronic components 21 are mounted on the outer and the inner surfaces of the ceramic element 2 of the ceramic structural body 1. A conductive metal material is filled in the hole 7 to connect the metal layers provided on the inner and the outer surfaces of the ceramic element 2 with each other.

The thus formed structure has no exposed lamination joint as in the prior laminated ceramic structure so that in forming the metal layers 5, 6 on the inner surface of the ceramic element 2 by electroless plating there is no fear of short-circuiting the metal layers by the plated film formed on such a joint. Moreover, ceramic element 2 consisting of ceramic material having substantially uniform thickness is used as a ceramic structural body. That is, the outer shape of the ceramic element 2 substantially corresponds to the inner shape thereof and the thickness and the density of each portion of the ceramic element 2 are essentially uniform so that in firing the ceramic structural body no deformation such as bending is caused and the yield of product becomes excellent and thus the electronic components mounted on the ceramic element 2 are not subjected to thermal influence since the heat can be dissipated fast from the hole surface of the ceramic element 2 which is thin and has a large surface area.

Other embodiments of the present invention will be explained with reference to FIGS. 2 to 22. In the following embodiments, like reference numerals indicate corresponding parts shown in FIG. 1 and the explanations thereof are omitted.

Figure 2:
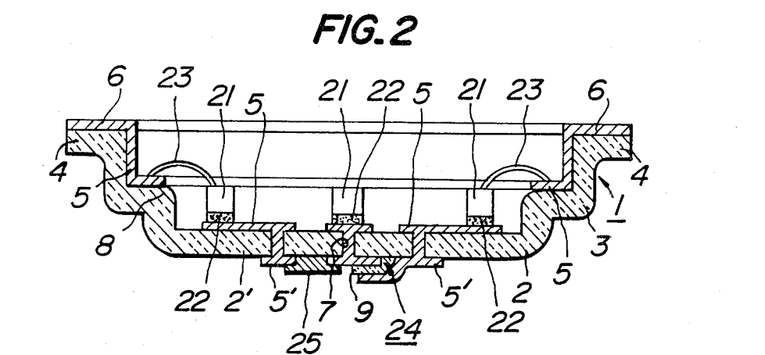
FIGS. 2 to 5 are cross-sectional views showing other embodiments of the ceramic structural body according to the present invention.

In the second embodiment of the invention shown in FIG. 2, a step portion 8 is provided in the sidewall portion 3. Between a plurality of metal layers 5 provided in the base (in this embodiment, bottom) portion 2' of the ceramic element 2 are provided an insulating layer or dielectric layer 9 and a resistance material 10 by a printing method and thick film technique so as to form a capacitor 24 and a resistor 25. This embodiment differs from the ceramic structural body of the first embodiment shown in FIG. 1. In this case, the flange portion 4 and the step portion 8 of the sidewall portion 3 are provided with metal layer 6, and metal layers 5 are provided on both the inner and outer surfaces of the bottom plate portion 2'. The remainder of the structure is the same as that of the ceramic structural body shown in FIG. 1 and explanation thereof is omitted.

In the thus constructed ceramic structural body, the thickness and density of each portion of the ceramic element 2 are substantially uniform, so that any deformation such as warping or the like at the time of sintering is avoided, and because of the excellent heat dissipation and reinforcing effect of the flange portion 4 and the step portion 8, even if the ceramic element 2 is thin, sufficient strength can be obtained. Further, the resistor and capacitor are formed by a printing method, sintered and integrated with the ceramic structural body, so that any trouble caused by bad connections is reduced and packaging density can be raised.

Figure 3:
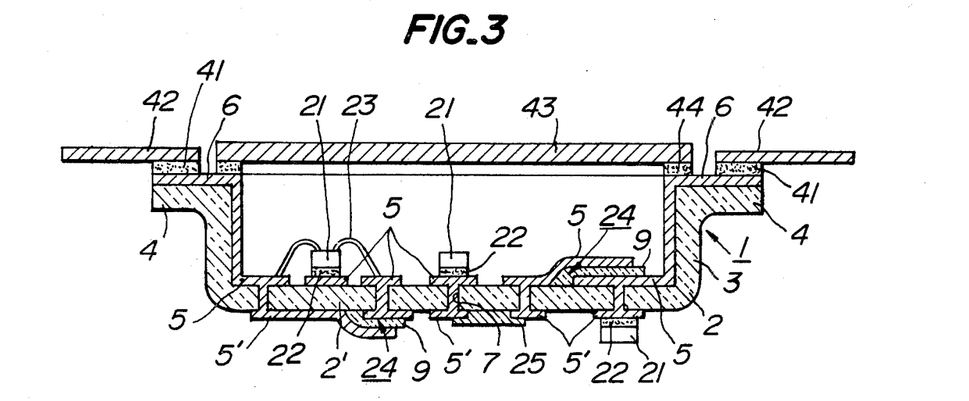

In the third embodiment of the ceramic structural body according to the invention as shown in FIG. 3, to the metal layer 6 of the flange portion 4 are secured metal leads 42 by means of a welder 41. The active element 21 of the electronic component and the capacitor 24 and the resistor 25, provided by a printing method or thick film technique, are connected to the

METHOD OF MANUFACTURING A CERAMIC STRUCTURAL BODY

This is a division of application Ser. No. 970,444 filed Dec. 18, 1978, now abandoned.

BACKGROUND OF THE INVENTION

1. Field of the Invention

The present invention relates to a ceramic structural body having electronic components thereon, a ceramic package for mounting electronic components therein and a ceramic circuit board having electronic components thereon and a method of manufacturing the same.

2. Description of the Prior Art

Such a ceramic structural body is formed by laminating a plurality of frame shaped ceramic green sheets each having metal layers thereon to form a cavity portion for mounting electronic components therein. The laminated green sheets are fired, electronic components are mounted in the cavity portion and these are connected to the metal layers. This ceramic structural body has the disadvantage that mass production cannot be achieved because of the complicated laminating step. Further, when the metal layer is subjected to electroless plating, the plating solution remaining at the joint formed between the ceramic plates in the cavity forms a plated film at the joint resulting in the formation of short-circuited metal layers. Also, in the laminating process, since the lamination is made by pressing and heating a plurality of frame shaped ceramic plates sandwiched by metal plates the thickness and density or compactness of each portion of the ceramic structural body is inhomogeneous and thus deformation such as bending occurs during firing of the ceramic structural body and heat is not dissipated with excellent efficiency from the whole ceramic structural body due to the inhomogeneous thickness.

SUMMARY OF THE INVENTION

An object of the present invention is to eliminate the above described disadvantages.

Another object of the present invention is to provide a ceramic structural body having uniform thickness and density at each portion thereof by utilizing a ceramic green sheet and by abbreviating the laminating process so that the problem of the plating solution remaining at the lamination joint and short-circuiting the metal layers with each other does not occur.

A further object of the present invention is to provide a ceramic structural body in which deformation such as bending does not occur during firing.

Another object of the present invention is to provide a ceramic structural body having excellent heat dissipation.

A further object of the present invention is to provide a method of manufacturing a ceramic structural body.

A ceramic structural body according to the present invention comprises a ceramic element of a ceramic layer having substantially uniform thickness formed into a dish-shaped or box-shaped configuration and includes a base portion, a sidewall portion extending from the base portion substantially at right angles thereto, and a flange portion extending from the free end of the sidewall portion substantially at right angles thereto; a plurality of metal layers formed on the surface of the desired portions of the ceramic element; and at least one electronic component mounted on at least one of the metal layers and having electrodes connected to other metal layers through fine lead wires.

The ceramic element is formed by press forming a ceramic green sheet. The sidewall portion has at least one step portion. The ceramic structural body may comprise means for covering an opening formed by the sidewall portion. The ceramic structural body may comprise a second ceramic structural body secured to the ceramic structural body and having same structure as that thereof, and electronic components mounted on the second ceramic structural body being electrically connected to the metal layers formed on the flange portion of the ceramic structural body. The ceramic structural body may comprise a third ceramic structural body secured to the second ceramic structural body and having same structure as that of the first ceramic structural body, and electronic components mounted on the third ceramic structural body being electrically connected to the metal layers formed on the flange portion of the ceramic structural body. The ceramic structural body may comprise a circuit board having conductive strips provided thereon and a hole corresponding to an opening formed by the sidewall portion, the opening being surrounded by the flange portion of the ceramic element, and the conductive strips electrically connected to the metal layers formed on the ceramic element through the metal layers formed on the flange portion.

According to the present invention a method of manufacturing a ceramic structural body comprises steps of preparing a ceramic green sheet having substantially uniform thickness; coating a desired pattern of print layers on the surface of the green sheet by metallizing paste; press-forming the pattern coated green sheet to form a ceramic element of dish-like or box-like configuration having a base portion, a sidewall portion and a flange portion and in which the pattern of the metal layer is printed on desired portions of at least inner side of the green body; firing the ceramic green body to form a ceramic body; subjecting the ceramic body to a surface treatment such as plating or thick film working to make at least a part of the print layers conductive by forming metal layers; mounting at least one electronic component on at least one of the metal layers of the resulting ceramic element; and electrically connecting the electronic component to other metal layers of the ceramic element through fine lead wires.

A ceramic package according to the present invention comprises a ceramic element of a ceramic layer having substantially uniform thickness, the ceramic element including a base portion, a sidewall portion extending from the base portion substantially at right angles thereto, a flange portion extending from the free end of the sidewall portion substantially at right angles thereto; and a plurality of metal layers from on the surface of desired portions of the ceramic element, the metal layers being capable of mounting at least one electronic component thereon.

A ceramic circuit board according to the present invention comprises a ceramic plate member having substantially uniform thickness; a ceramic element of a ceramic layer having substantially uniform thickness to that of the plate member, the ceramic element including a base portion, a sidewall portion extending from the base portion substantially at right angles thereto, and a flange portion extending from the free end of the sidewall portion substantially at right angles thereto, the flange portion being integrally connected to the plate outer electronic component (not shown) through the metal layers 5, 6 and the metal lead 42. In the present embodiment, the electronic components 21, 24, 25 which have the possibility of being influenced by an external environment are mounted in the ceramic element 2, i.e., the inside of the base portion 2'. An upper opening 12 of ceramic element 2 is hermetically sealed with lid member 43 consisting of ceramics or metal through glass with a low melting point 44, so that these electronic components 21, 24, 25 can be protected. The remaining structure of the ceramic structural body in the present embodiment is the same as that shown in FIG. 1 or 2 and its explanation is omitted.

When the thus constructed ceramic structural body in the present embodiment is secured to a circuit board (not shown) and the metal lead 42 is electrically connected to the conductive strip thereof, since desired electronic components 21, 24, 25 are hermetically sealed in the inside of the hat member 2 of the ceramic structural body 1, a highly reliable ceramic structural body can be provided. The sealed electronic components are not subjected to the influence of an external environment because of the high heat resistance, oxidation resistance and electric insulation inherent in the ceramic material.

Figure 4:
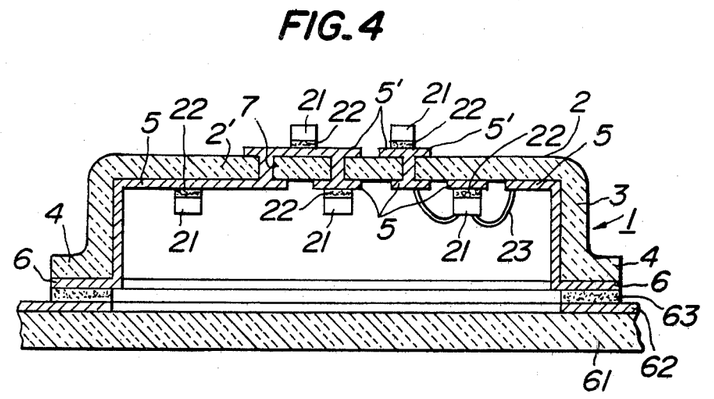

In the fourth embodiment of the ceramic structural body 1 according to the invention as shown in FIG. 4, the ceramic element 2 is used so that its opening is fixed to a circuit board 61 and sealed. The conductive strips 62 provided on the circuit board 61 and the metal layer 6 provided on the flange portion 4 of the hat member 2 are directly and electrically connected by means of the solder 63 or the like. The electronic components mounted in the inside of the ceramic element 2 are hermetically sealed. The remaining structure of the ceramic structural body in the present embodiment is the same as that shown in FIG. 1, so that its explanation is omitted.

The thus constructed ceramic structural body 1 in the present embodiment requires no lead wire, is miniaturized, and simplified in assembly. Further, active element 21 as the electronic component provided in the ceramic element 2, i.e., the inside of the base portion 2' is hermetically sealed in the circuit board 61, so that the function of the active element 21 is prevented from deterioration and its life is prolonged.

Figure 5:
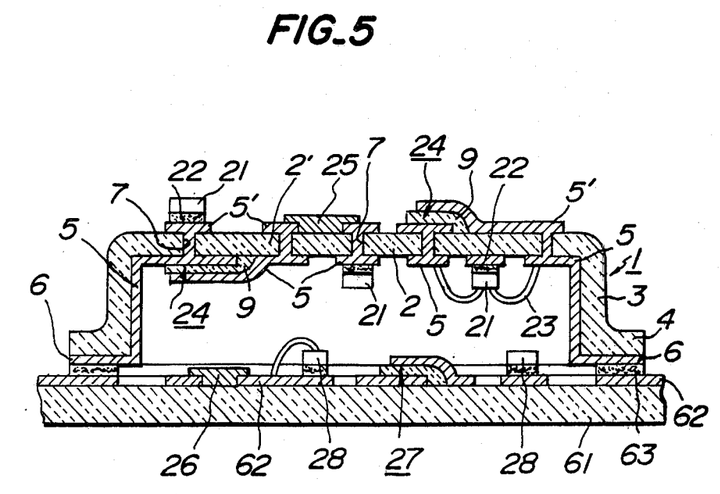

In the fifth embodiment of the ceramic structural body 1 according to the invention as shown in FIG. 5, the ceramic element 2 shown in FIG. 3 is used, and the circuit board 61 is used instead of the lid member 43 and the metal lead 42. That is, to the conductive strips 62 provided at a desired position of the circuit board 61 is fixed the metal layer 6 of the flange portion 4 by means of the solder 63. Further, in the present embodiment, in the conductive strips 62 of the circuit board 61 are provided the capacitor 26, the resistor 27 and the active element 28 of the electronic component by a printing method or thick film technique, so that the electronic components provided in the inside of the base portion 2' of the ceramic element 2 are satisfactorily sealed from the influence of the external environment. Further, the packaging density is considerably heightened together with other advantages such as miniaturization and light weight.

Figure 6:
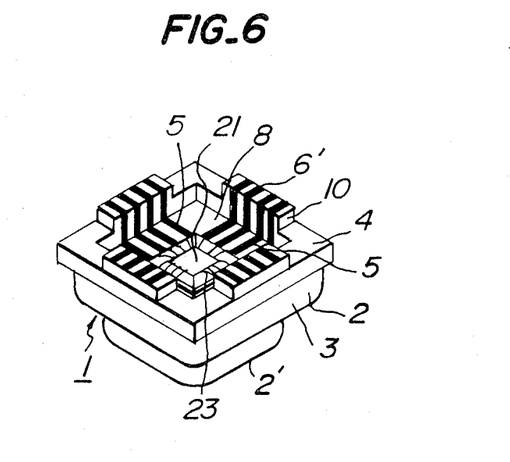
FIG. 6 is a perspective view showing another embodiment of the ceramic structural body according to the present invention.
Figure 7:
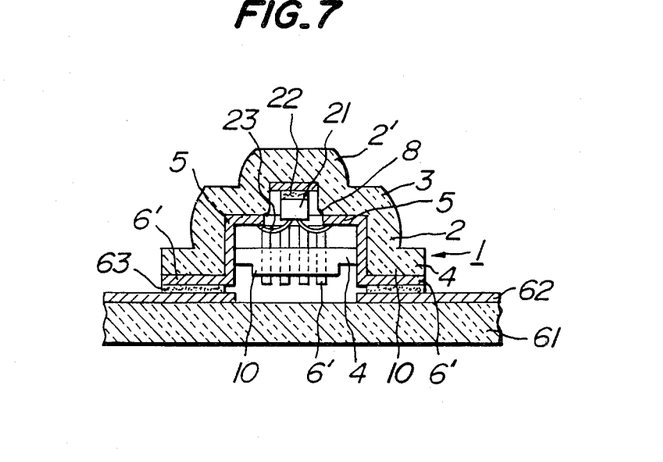
FIG. 7 is a cross-sectional view of the ceramic structural body shown in FIG. 6.

In the sixth embodiment of the ceramic structural body according to the invention as shown in FIGS. 6 and 7, the step portion 8 is provided on the sidewall portion 3 of the ceramic element 2 having substantially the same thickness. A plurality of projected portions 10 are integrally provided in the flange portion 4, and a plurality of the metal layers 6' and 5 are coated on the step portion 8 from these projected portions 10 metal layers 5 are also provided in the inner surface of the base portion 2'. The active element 21 on the electronic component is mounted thereon through the conductive adhesive 22, and the active element 21 and the metal layer 5 on the step portion 8 are electrically mutually connected by the fine conducting wire 23. In the present embodiment, the base portion 2' is not provided with the through-hole 7.

In the thus constructed ceramic structural body 1, the metal layer 6' of the flange portion 4 is electrically connected to the conductive strips 62 provided in the circuit board 61 as shown in FIG. 7 by means of the solder 63.

In the ceramic structural body 1 the construction of the present embodiment, when the ceramic element 2 is fixed to the circuit board 61 by means of the solder 63 or the like, the air or flux cracked gas remaining in the inside of the ceramic element 2 is extruded to the outside from a gap between the flange portion 4 and the conductive strips 62 of the circuit board 61 formed by the projected portion 10, so that, without any trouble caused by these remained air and flux cracked gas, the solder between the metal layer 6' on the projected portion 10 of the hat member 2 and the conductive strips 62 of the circuit board 61 is sufficiently permeated by capillary action, and as a result, the electric connection of the ceramic element 2 with the circuit board 61 is positively carried out and the adhesion strength is remarkably increased.

Figure 8:
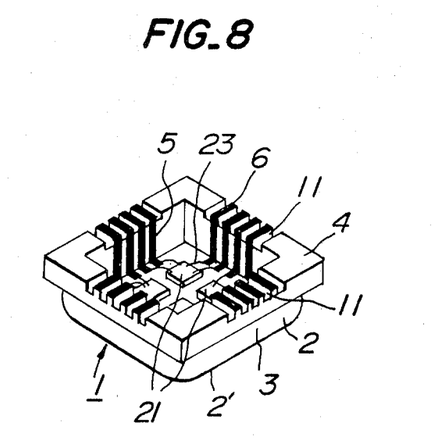
FIG. 8 is a perspective view showing another embodiment of the ceramic structural body according to the present invention.
Figure 9:
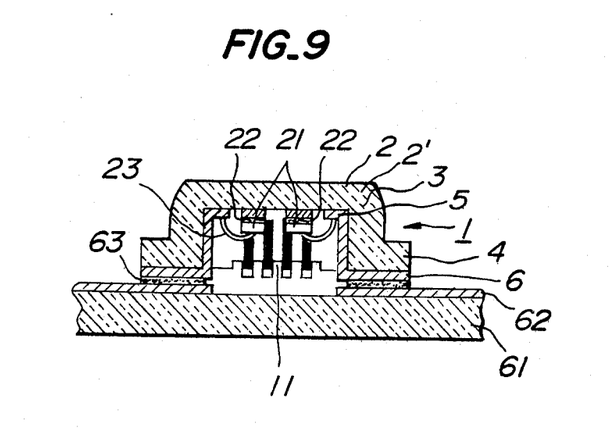
FIG. 9 is a cross-sectional view of the ceramic structural body shown in FIG. 8.

In the seventh embodiment of the ceramic structural body 1 according to the invention as shown in FIGS. 8 and 9, as well as the embodiment shown in FIG. 1, on the metal layer 5 provided in the inside of the base portion 2' of the ceramic element 2 having substantially the same thickness is mounted the active element 21 of the electronic component, for instance, an integrated circuit. Further, on the sidewall portion 3 and the flange portion 4 are provided a plurality of metal layers 5 and 6, respectively, and these metal layers 5 and 6 are electrically and mutually connected with the active element 21 by means of the fine conducting wire 23. In the present embodiment, particularly between the plurality of the metal layers 6 provided on the flange portion 4, respectively, each groove 11 is formed so that insulation can be improved by these grooves 11. In the present embodiment, no through-hole 7 is formed in the base portion 2'.

The thus constructed ceramic structural body 1 is secured to the desired conductive strips 62 of the circuit board 61 as shown in FIG. 9 by solder 63. In the present embodiment, since the grooves 11 are provided at certain positions of the metal layer 6, at the time of soldering, a short-circuit between the electrodes caused by a bridge of the soldering is prevented. Poor insulation can be prevented because the distance of surface leakage between the adjacent conductive metal layers 6 becomes long, and electrical characteristics can be improved. Even in case of mounting electronic components of high integrated density having multi-terminals, therefore, miniaturization becomes possible without deteriorating performance.

In the present embodiment, the grooves 11 are only provided in the metal layer of the flange portion 4, but the grooves 11 can also be provided in the plurality of the metal layers 5 provided on the sidewall portion 3 and the base 2', and in this case, the electrical characteristics of the ceramic structural body 1 can be remarkably improved.

Figure 10:
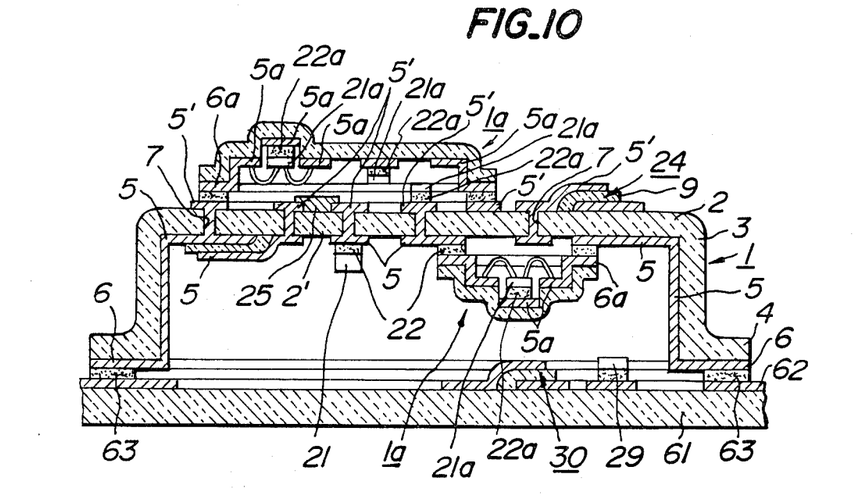
FIGS. 10 to 13 are cross-sectional views showing other embodiments of the ceramic structural body according to the present invention.

In the eighth embodiment of the ceramic structural body 1 according to the invention shown in FIG. 10, use was made of the ceramic structural body 1 similar to that shown in FIGS. 4 and 5. On the circuit board 61 were mounted the active element 29 and the capacitor 30 as the passive element of the electronic components. In the inside of the ceramic element 2, i.e., the inner side of the base portion 2', was mounted a second ceramic structural body 1a similar to that shown in FIG. 2, and in the outer side surface of the base portion 2' was mounted the similar second ceramic structural body 1a.

The thus constructed ceramic structural body 1 in the present embodiment is a hybrid integrated circuit, and as a result, the packaging density can be heightened and the yield of the final product can be improved. This is because that the electronic components of the second ceramic structural body 1a secured to both the inner and outer side surfaces of the base portion 2' are inspected before securing the second ceramic structural body 1a to the ceramic structural body 1 and inferior electronic components can be removed. In addition, as the second ceramic structural body 1a, use may be made of laminated layer type ceramic structural body made by laminating a plurality of ceramic plates instead of the second ceramic structural body.

Figure 11:
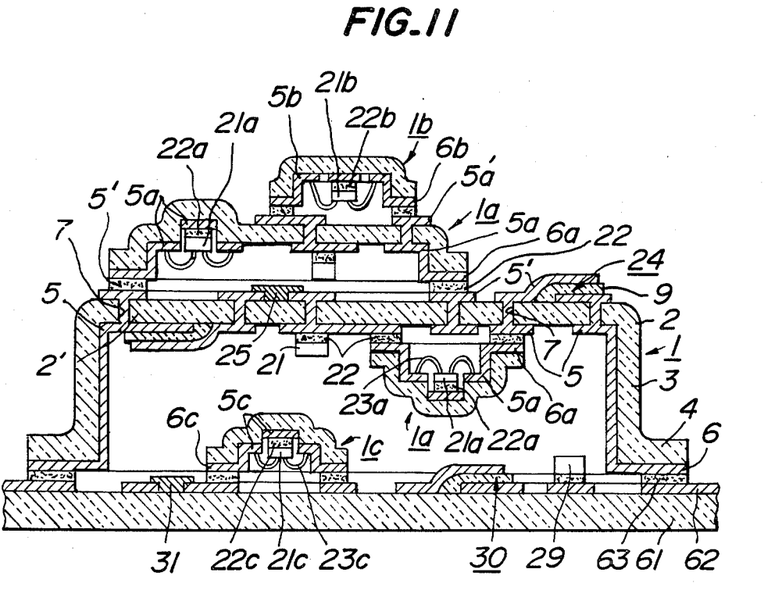

In the ninth embodiment of the ceramic structural body according to the invention as shown in FIG. 11, on the outer side surface of the second ceramic structural body 1a provided on the outer side surface of the base portion 2' is provided a third ceramic structural body 1b and on the portion of the circuit board 61 positioned at the inner side of the ceramic structural body 1 is provided a fourth ceramic structural body 1c. The remaining structure is entirely the same as that shown in FIG. 10 and its explanation is omitted. The ceramic structural body in the present embodiment has entirely the same effect as that shown in FIG. 10.

Figure 12:
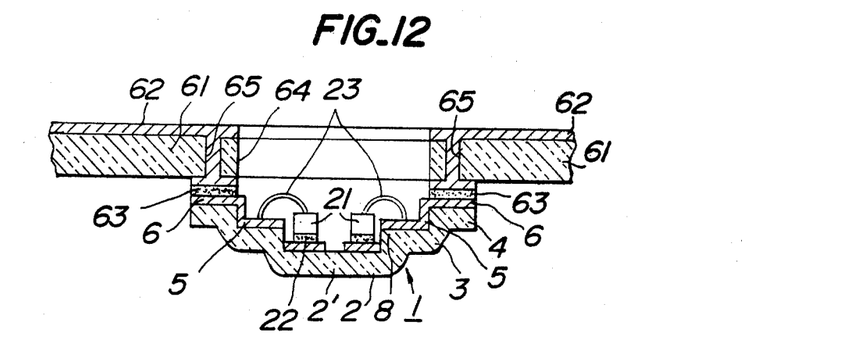

In the tenth embodiment of the ceramic structural body according to the invention shown in FIG. 12, use is made of the ceramic structural bodies shown in FIGS. 1, 2, 6, and 8, and there is formed a hole 64 in the circuit board 61, having a size equal to the opening formed by the sidewall portion 3 of the ceramic structural body 1 in the circuit board 61. Further, in the circuit board 61 is formed a through-hole 65 at a desired position around the hole 64, and the conductive strips 62 of the metal layer are extended to the rear side surface of the circuit board 61 through the through-hole 65. In the present embodiment, the metal layer 6 provided on the flange portion 4 of the ceramic structural body 1 is secured to the conductive strips 62 provided at the rear side of the circuit board 61 by means of the solder 63, so as to coincide the hole 64 of the circuit board 61 with the opening of the ceramic structural body 1.

The ceramic structural body 1 in the present embodiment is made by opposing the hole 64 of the circuit board 61 to the opening of the sidewall portion 3, so that the cooling efficiency can be raised, and as a result, the active element 21 of the electronic component can effectively be protected.

Figure 13:
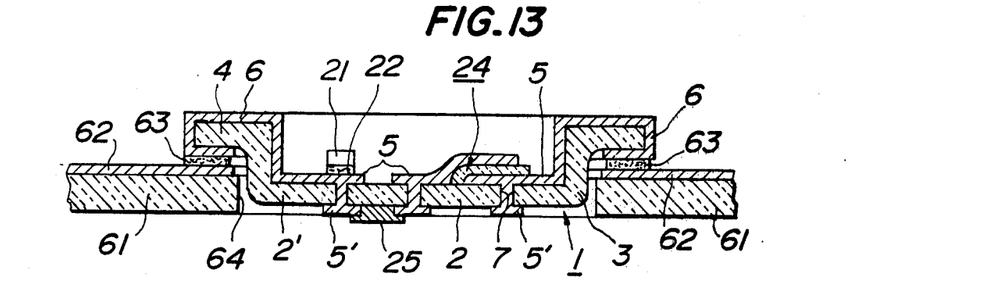

In the eleventh embodiment of the ceramic structural body 1 according to the invention shown in FIG. 13, use is made of the ceramic structural body shown in FIGS. 1, 3, 4, 5 and 8, and the circuit board 61 is provided with a hole 64 having a size large enough to accept the sidewall portion 3 of the ceramic structural body 1. The sidewall portion 3 is accommodated in this hole 64, and the metal layer 6 extended to the backside of the flange portion 4. The conductive strips 62 of the circuit board 61 are mechanically and electrically connected with each other by the solder 63.

The thus constructed ceramic structural body 1 in the present embodiment is made in such a manner that, in accommodating the sidewall portion 3 in the hole 64 of the circuit board 61, the sidewall portion 3 exhibits the positioning function, the assembling work of the ceramic element 2 into the circuit board 61 is considerably simplified, the thickness of the assembly is small, and miniaturization as a whole becomes possible.

In addition, in embodiments shown in FIGS. 12 and 13, the metal layers 5, 6 of the ceramic structural body 1 can be provided with grooves 11 as shown in FIG. 8. In this case, as well as the aforementioned embodiment, the distance of surface leakage can be made long, and as a result, the insulation can be raised and the electrical characteristics can naturally be improved.

A method of manufacturing the ceramic structural body according to the present invention will be explained as follows.

In the first place, to ceramic powder such as alumina, beryllia, forsterite, etc., to which a flux is added thereto, are added an organic binder such as polyvinyl butyral, ethyl cellulose, etc., and a solvent such as toluene, isopropyl alcohol, etc. This mixture is kneaded and a ceramic green sheet is formed by a known technique such as a doctor blade method, extrusion method or the like. On the green sheet is formed a printed layer having a desired pattern for forming the metal layer and the capacitor with the use of a paste mainly consisting of a high melting metal powder such a molybdenum, tungsten, etc., and a paste mainly consisting of an insulator or a dielectric material such as ceramics, glass, etc. The necessary portion of the ceramic green sheet on which the printed layer is formed is press-formed by means of a mold so as to form a ceramic green body having the ceramic element of dish-shaped or box-shaped configuration to which the inner surface of a part of the printed layer reaches. The ceramic green body is sintered in a non-oxidizing atmosphere at a temperature of 1,400°–1,700° C. At least a part of the printed layer is subjected to a surface treatment such as plating, thick film working or the like. A ceramic structural body provided with the metal layer on a desired portion of the ceramic element 2 is formed. Finally, either one or both of the inner and outer surfaces of the base portion of the ceramic element is mounted with a suitable number of active elements and passive elements of electronic components, and the electronic components are electrically connected to the metal layer by the fine lead wire, and as a result, the complete ceramic structural body is formed.

According to the manufacturing method of the invention, as compared with a conventional ceramic structural body formed by laminating a plurality of frame-like ceramic green sheets, a ceramic structural body can easily be mass-produced from a single ceramic green sheet having substantially uniform thickness by press forming, so that its workability becomes advantageously superior to the conventional manufacturing method.

An embodiment of a ceramic package according to the present invention will be explained with reference to FIGS. 14 to 20.

Figure 14:
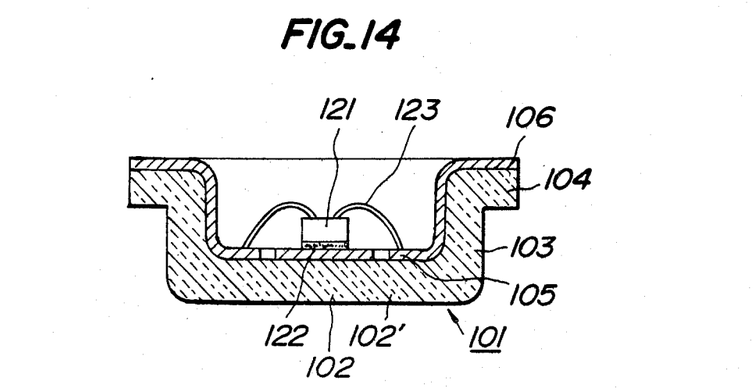
FIG. 14 is a cross-sectional view showing one embodiment of a ceramic package according to the present invention.

In the first embodiment of the ceramic package according to the invention shown in FIG. 14, the ceramic package 101 is provided with a ceramic element 102 having substantially uniform thickness, and the ceramic element 102 is composed of a base portion 102', a cylindrical sidewall portion 103 and a flange portion 104 provided along the periphery of the sidewall portion 103. The base portion 102' and the sidewall portion 103 are provided with the metal layers 105 at a desired portion, and the flange portion 104 is provided with the metal layer 106 at a desired portion. These metal layers 105 and 106 are electrically insulated or electrically connected, if desired.

On at least one of the metal layers 105 applied to the inner side surface of the base portion 102' of the thus constructed ceramic package 101 is mounted the active element 121 of the electronic component, and the active element 121 is electrically connected to the metal layer 105 by the fine lead wires 123.

Such a ceramic package as shown in this embodiment has an effect similar to that of the ceramic structural body shown in FIG. 1.

Figure 15:
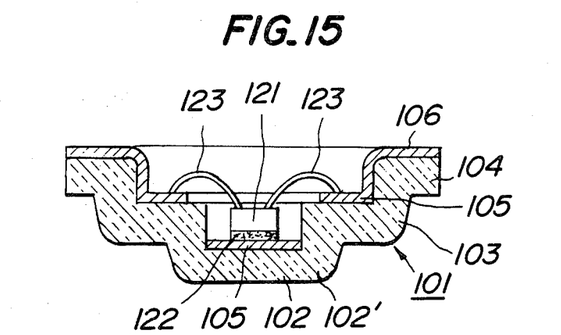
FIGS. 15 to 20 are cross-sectional views showing other embodiments of the ceramic package according to the present invention.

In the second embodiment of the ceramic package 101 according to the invention shown in FIG. 15, the sidewall portion 103 is provided with a step portion 108, which differs from the first embodiment shown in FIG. 14. The other points are entirely the same as the first embodiment.

The thus constructed ceramic package in the present embodiment has sufficient strength even if made considerably thin because the flange portion 104 and the step portion 108 of the sidewall portion 103 are reinforced as well as in the case of the ceramic structural body shown in FIG. 2.

Figure 16:
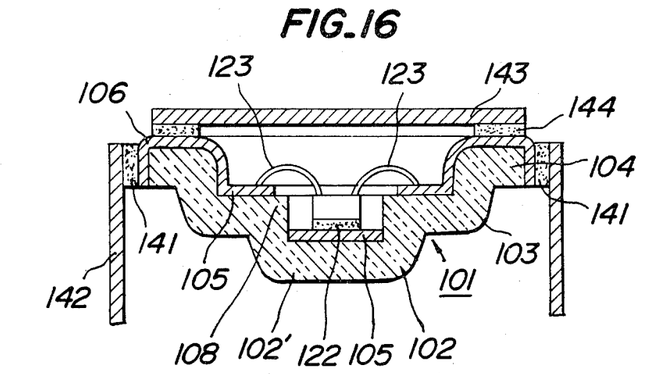

In the third embodiment of the ceramic package according to the invention shown in FIG. 16, in the same manner as shown in the second embodiment, the sidewall portion 103 of the hat member 101 is provided with a step portion 108. The metal layer 106 is extended to the side of the flange portion 104, the metal lead 142 is secured to the side of the metal layer 106 by the solder 141, the lid member 143 is secured to the metal layer 106 on the upper surface of the flange portion 104 by the low melting glass 144, and the inside of the ceramic element 102 is hermetically sealed.

The thus constructed ceramic package in the present embodiment has the effect similar to the ceramic structural body shown in FIG. 3.

Figure 17:
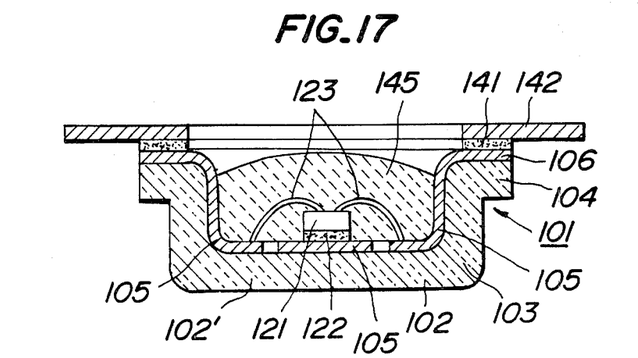

In the fourth embodiment of the ceramic package according to the invention shown in FIG. 17, the construction is entirely the same as that of the ceramic package 101 of the first embodiment shown in FIG. 14. Metal leads 142 are secured to the flange portion 104 by the solder 141, a filler 145 is filled in the inside of the ceramic element 102 and the active element 121 of the electronic component is hermetically sealed.

The thus constructed ceramic package has entirely the same effect as in the third embodiment shown in FIG. 16.

Figure 18:
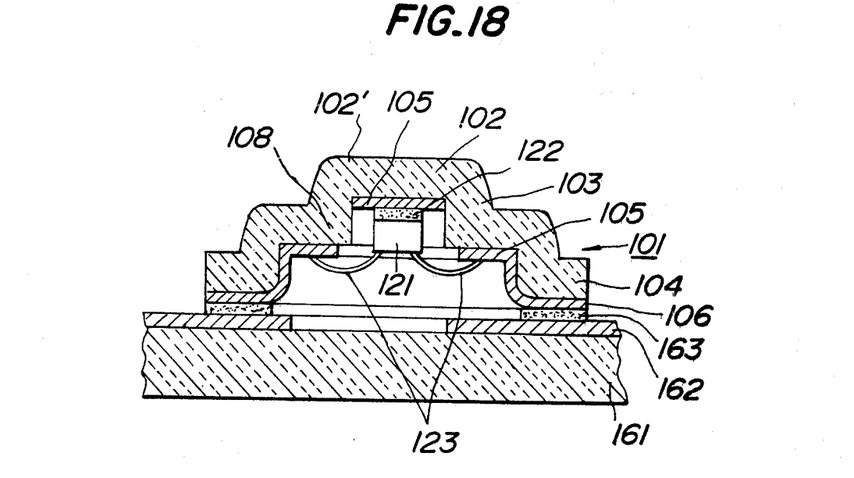

In the fifth embodiment of the ceramic package according to the invention shown in FIG. 18, the ceramic package shown in FIG. 15 is used, the metal layers 106 of the flange portion 104 are secured to the conductive strips 162 provided on the surface of the circuit board 161 by the solder 163 and electrically connected.

The thus constructed ceramic package in the present embodiment has the effect similar to the ceramic structural body shown in FIG. 4.

Figure 19:
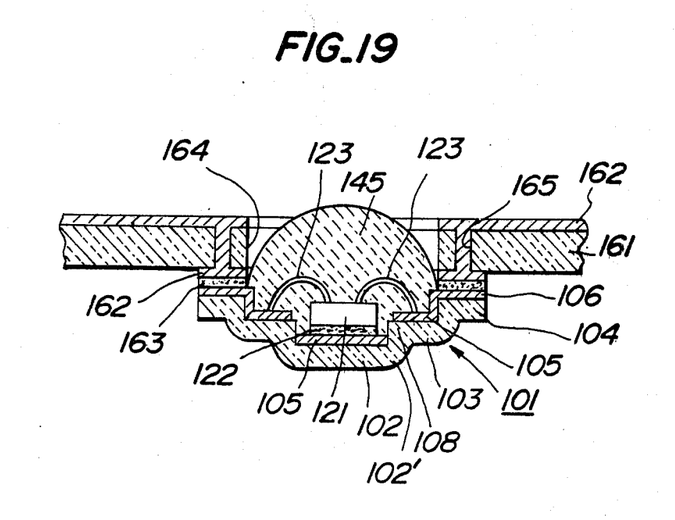

In the sixth embodiment of the ceramic package according to the invention shown in FIG. 19, there are used the ceramic element 102 and the circuit board 161 having a construction similar to the ceramic structural body shown in FIG. 12. The filler 145, such as synthetic resin or the like is filled in the inside of the ceramic element 102, and the active element 121 of the electronic component is hermetically sealed.

The thus constructed ceramic package in the present embodiment has the effect similar to that of the tenth embodiment of the ceramic structural body shown in FIG. 12. Since the active element 121 of the electronic component is hermetically sealed in the ceramic element 102 by the filler 145, the active element 121 of the electronic component is not deteriorated by receiving the external environment and can withstand for long use. As shown in FIG. 19, if a part of the filler 145 is projected from the opening end of the sidewall portion 103, i.e., above the level of the flange portion, in conical or tapered form, the filler projected portion acts as a guide to the hole 164 of the circuit board when the ceramic element 102 is secured to the circuit board 161, exhibits the positioning function and makes the assembling work easy. Further, as the filler 145, if transparent material such as light-transmissible transparent synthetic resin or the like is used, a semiconductor element responsive to light transmitted through the filler 145 can be used as the active element of the electronic component such as a photosensitive diode or a light-receiving element, and as a result, it can widely be applied to optical instruments such as cameras.

Figure 20:
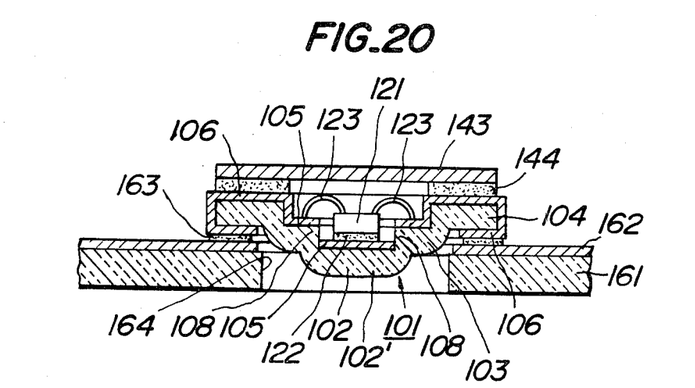

In the seventh embodiment of the ceramic package according to the invention shown in FIG. 20, with the use of the ceramic element 102 shown in FIG. 16 but without the metal lead 142 and a circuit board 161 provided with a hole 164 having a size corresponding to the outermost side surface of the sidewall portion 103, the ceramic element 102 is accommodated in the hole 164 as illustrated, the conductive strips 162 of the circuit board 161 are secured to the metal layers 106 extended to the rear side of the flange portion 104 of the hat member 102 by the solder 163 and electrically connected.

The thus constructed ceramic package of the present embodiment has an effect similar to the embodiment shown in FIG. 13 and further has an effect similar to the embodiment shown in FIG. 16.

Figure 21:
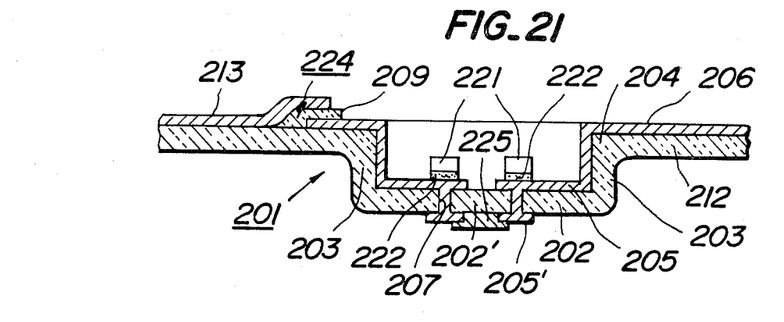
FIG. 21 is a cross-sectional view showing one embodiment of a ceramic circuit board according to the present invention.

A ceramic circuit board according to the present invention will be explained with reference to FIGS. 21 and 22.

The ceramic circuit board according to the invention is made by integrally constructing the ceramic structural body and the circuit board shown in the preceding embodiments. That is, it is similar to a conventional circuit board by enlarging and extending the flange portion of the ceramic element. The ceramic circuit board 201 according to the invention, therefore, comprises a flat plate portion 212 having substantially uniform thickness and recessed portions 203 having substantially uniform thickness provided at desired portions. The flat plate portion 212 is provided with the metal layers 213 at desired portions. Between desired portions of these metal layers 213 is inserted an insulating body 210 so as to form a capacitor 224 as a passive element. To the desired portion on the inner side surface of the recessed portion 203 are applied the metal layers 204. The metal layers 204 are extended to the outer side surface of the recessed portion 203 through through-holes 207 formed in the base portion 202' of the recessed portion 203, and the outer side surface is also provided with the resistor 225 as a passive element. Further, the inner bottom surface of the recessed portion 203 is provided with active elements 221 as an electronic component.

The thus constructed ceramic circuit board according to the invention is made by integrally constructing the ceramic structural body with the circuit board, and as a result, it is advantageous as requiring no assembling work.

Figure 22:
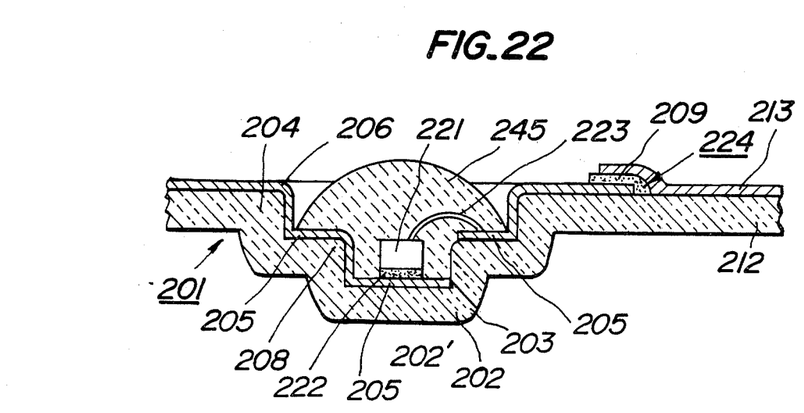
FIG. 22 is a cross-sectional view showing another embodiment of the ceramic circuit board according to the present invention.

In the second embodiment of the ceramic circuit board according to the invention shown in FIG. 22, a step portion 208 is provided in the sidewall 203' of the recessed portion 202 for forming the ceramic element, and the filler 245 is filled in the inside of the recessed portion 202, thereby hermetically sealing the active element 221 of the electronic component. The remaining structure is substantially the same as that shown in FIG. 21.

In addition, in all the embodiments of the invention explained in the above, if the metallized layer and the insulating layer of dielectric layer are alternatively printed or more than two of ceramic green sheets each having the properly metallized print layer are laminated and press-formed for forming the sidewall portion, a multi-layered ceramic structural body can be obtained.

As is apparent from the above, according to the invention, the ceramic structural body or ceramic package can be obtained having a ceramic element with no exposed laminated joint and having substantially uniform thickness by press-forming the ceramic green sheet having almost uniform thickness and sintering it. The invention can solve the problem of the conventional laminated layer type ceramic structural body or ceramic package, remarkably simplify the manufacturing process, and make mass production easy.

What is claimed is:

1. A method of manufacturing a ceramic structural body comprising:
   preparing a ceramic green sheet of substantially uniform thickness;
   forming at least one through-hole through the thickness of the ceramic green sheet;
   filling the through-hole with electrically conductive material;
   selectively coating a surface of said ceramic green sheet with metallizing paste to achieve a desired pattern of print layers;
   press-forming the coated ceramic green sheet to form a substantially concave-convex green ceramic member having
   a plate portion,
   a sidewall portion extending from said plate portion at substantially right angles thereof,
   a flange portion extending from the free end of said sidewall portion at substantially right angles thereto,
   wherein said print layers are on the concave side of said green ceramic member;
   sintering said green ceramic member;
   treating said sintering ceramic member to form electrically conductive metal layers from at least part of said print layers;
   mounting at least one electronic component on said sintered ceramic member; and
   electrically connecting said electronic component to said metal layers.

2. The method of claim 1, wherein the electrically conductive material in the through-holes electrically connects electronic components through the sintered ceramic member.

3. A method as claimed in claim 1, wherein said sidewall portion has at least one step portion.

4. A method of manufacturing a ceramic structural body comprising:
   preparing a ceramic green sheet of substantially uniform thickness;
   forming at least one through-hole through the thickness of the ceramic green sheet;
   filling the through-hole with electrically conductive material;
   selectively coating a surface of said ceramic green sheet with metallizing paste to achieve a desired pattern of print layers;
   printing insulating paste on at least a part of said print layers;
   press-forming the coated ceramic green sheet to form a substantially concave-convex green ceramic member having
   a plate portion,
   a sidewall portion extending from said plate portion at substantially right angles thereto,
   a flange portion extending from the free end of said sidewall portion at substantially right angles thereto,
   wherein said print layers are on the concave side of said green ceramic member;
   sintering said green ceramic member;
   treating said sintered ceramic member to form electrically conductive metal layers from at least part of said print layers;
   mounting at least one electronic component on said sintered ceramic member; and
   electrically connecting said electronic component to said metal layers.

5. The method of claim 4, wherein the electrically conductive material in the through-holes electrically connects electronic components through the sintered ceramic member.

6. A method of manufacturing a ceramic structural body comprising:
   preparing a ceramic green sheet of substantially uniform thickness;
   forming at least one through-hole through the thickness of the ceramic green sheet;
   filling the through-hole with electrically conductive material;
   selectively coating a surface of said ceramic green sheet with metallizing paste to achieve a desired pattern of print layers;
   printing dielectric insulating paste on at least a part of said print layer;
   press-forming the coated ceramic green sheet to form a substantially concave-convex green ceramic member having
   a plate portion;
   a sidewall portion extending from said plate portion at substantially right angles thereto;
   a flange portion extending from the free end of said sidewall portion at substantially right angles thereto;
   wherein said print layers are on the concave side of said green ceramic member;

sintering said green ceramic member;
treating said sintered ceramic member to form electrically conductive metal layers from at least part of said print layers;
mounting at least one electronic component on said sintered ceramic member;
electrically connecting said electronic component to said metal layers.

7. A method as claimed in claim 6, wherein said metallized layer in the inside of the recessed portion is filled with dielectric insulating filler material.

8. The method of claim 6, wherein the electrically conductive material in the through-holes electrically connects electronic components through the sintered ceramic member.

* * * * *